United States Patent
Taniguchi et al.

(10) Patent No.: US 6,794,956 B2
(45) Date of Patent: Sep. 21, 2004

(54) CIRCUIT SUBSTRATE HAVING RESISTIVE FILMS CONNECTING EXTERNAL TERMINALS IN SERIES WITH LANDS

(75) Inventors: Masaaki Taniguchi, Fukui-ken (JP); Hidekazu Kitamura, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/223,629

(22) Filed: Aug. 20, 2002

(65) Prior Publication Data

US 2003/0057470 A1 Mar. 27, 2003

(30) Foreign Application Priority Data

Sep. 12, 2001 (JP) .......................................... 2001-276336

(51) Int. Cl.[7] .............................. H03H 7/00; H01C 1/012
(52) U.S. Cl. ........................................ 333/172; 338/308
(58) Field of Search ................................. 333/172, 238, 333/185; 174/254; 204/192.22; 257/312, 676, 686; 338/162, 307, 308; 361/794; 29/620; 156/73.2

(56) References Cited

U.S. PATENT DOCUMENTS

| | | | | |
|---|---|---|---|---|
| 3,611,070 A | * | 10/1971 | Engeler ...................... | 257/312 |
| 3,625,783 A | * | 12/1971 | Coucoulas ................. | 156/73.2 |
| 4,176,445 A | * | 12/1979 | Solow ........................ | 29/620 |
| 4,777,718 A | * | 10/1988 | Henderson et al. .......... | 29/620 |
| 5,493,074 A | * | 2/1996 | Murata et al. ............... | 174/254 |
| 5,548,268 A | * | 8/1996 | Collins ....................... | 338/307 |
| 5,656,856 A | * | 8/1997 | Kweon ...................... | 257/686 |
| 5,834,832 A | * | 11/1998 | Kweon et al. .............. | 257/676 |
| 5,966,294 A | * | 10/1999 | Harada et al. .............. | 361/794 |
| 6,023,209 A | * | 2/2000 | Faulkner et al. ............ | 333/238 |
| 6,469,613 B2 | * | 10/2002 | Miura ........................ | 338/162 |
| 6,623,608 B2 | * | 9/2003 | Cropper et al. ........ | 204/192.22 |

* cited by examiner

Primary Examiner—Patrick Wamsley
(74) Attorney, Agent, or Firm—Keating & Bennett, LLP (57) ABSTRACT

A circuit substrate includes resistive films are disposed on the surfaces of lands included in a circuit pattern and these resistive films are used as resistances connected in series to a capacitor. Therefore, the resistances are connected in series without increasing the inductance in the capacitor, and accordingly, a circuit having a small impedance variation with respect to frequency can be obtained. Therefore, it is possible to obtain a power supply circuit and so forth having stable operation and fast response.

22 Claims, 9 Drawing Sheets

|  | REGULAR LAMINATED CERAMIC CAPACITOR | LOW-IMPEDANCE LAMINATED CERAMIC CAPACITOR |
|---|---|---|
| CAPACITANCE (μF) | 10 (C1) | 1 (C2) |
| ESR (mΩ) | 5 ($ESR_{C1}$) | 7 ($ESR_{C2}$) |
| ESL (pH) | 700 ($ESL_{C1}$) | 200 ($ESL_{C2}$) |

Fig. 9

| | REGULAR LAMINATED CERAMIC CAPACITOR | LOW-IMPEDANCE LAMINATED CERAMIC CAPACITOR |
|---|---|---|
| SPECIFIC RESISTANCE ($\mu\Omega$ cm) | 30000 ||
| LAND DIMENSIONS (mm) | 3.2 × 0.6 | 1.6 × 1.0 |
| APPLIED THICKNESS ($\mu$m) | 50 | 50 |
| ADDED RESISTANCE ($\mu\Omega$) | 16 | 17 |

Fig. 10

| FILLER TYPE | SPECIFIC RESISTANCE (μΩ cm) |
|---|---|
| SILVER | 80~100 |
| COPPER | 80~100 |
| CARBON | 10000~100000 |
| NICKEL | 1000 |

CIRCUIT SUBSTRATE HAVING RESISTIVE FILMS CONNECTING EXTERNAL TERMINALS IN SERIES WITH LANDS

BACKGROUND OF THE INVENTION

1. Field of the Invention

The present invention relates to circuit substrates upon which electronic components are mounted. In particular, the present invention relates to a circuit substrate having thereon an equivalent resistance component, which is connected in series to an electronic component such as a capacitor, an inductor, or other suitable component.

2. Description of the Related Art

Previously, power supply circuits for supplying an operating voltage have been provided in computers and other electrical apparatuses. These power supply circuits have been implemented by circuit substrates in which a plurality of bypass capacitors (decoupling capacitors) for improving the operating stability and for speeding up the operating response are connected in parallel and mounted on the substrates. Low-capacitance laminated ceramic capacitors or large-capacitance electrolytic capacitors made from aluminum, tantalum, or other material are used as the bypass capacitors, according to the power supply capacity, the switching frequency, the circuit parameters smoothing coils used therewith, etc.

In recent years, in laminated ceramic capacitors, as a result of developments in thin-film forming technology and lamination technology of dielectrics and internal conductors, the capacitance of laminated ceramic capacitors and the capacitance of electrolytic capacitors have become approximately the same, and experiments have been carried out to replace electrolytic capacitors with laminated ceramic capacitors. However, when replacing electrolytic capacitors with laminated ceramic capacitors, since the impedance in the frequency range used with laminated ceramic capacitors is too small, disturbances occur in the output power waveform of the power supply circuits. This is due to step-shaped changes in the input voltage of, for example, a three-terminal regulator included in the power supply circuit, since the equivalent series resistance (ESR), described later, is too small.

Moreover, when using electrolytic capacitors, the impedance in the frequency range used is larger than that of laminated ceramic capacitors. However, since this impedance is larger, heat generation easily occurs, and furthermore, the smoothness of the power supply line tends to deteriorate.

Here, the relationship between the frequency used and the impedance in the power supply circuit will be described. The impedance at the power supply side as seen from the load side, that is to say, the combined impedance of the parallel circuit composed of the plurality of capacitors, becomes large at a specific frequency (parallel resonance frequency) due to a parallel resonance effect. The point at which this combined impedance becomes large is known as the anti-resonant point. The combined impedance at this anti-resonant point becomes larger as the equivalent series resistance (ESR) of the capacitor becomes smaller.

As described above, because the capacitance of laminated ceramic capacitors has increased in recent years, coupled with the fact that the equivalent series inductance (ESL) is smaller, laminated ceramic capacitors are being used to replace electrolytic capacitors such as tantalum capacitors. However, since the equivalent series resistance (ESR) in large-capacitance laminated ceramic capacitors is small, the impedance at the anti-resonant point is increased.

Figure 1:
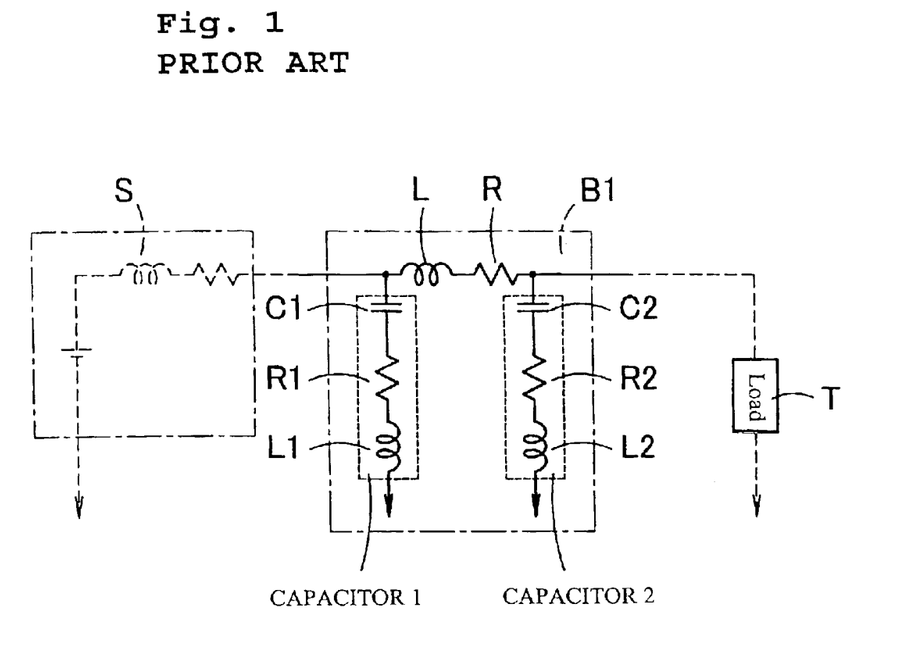
FIG. 1 is an equivalent circuit diagram including capacitors of a smoothing circuit mounted on a circuit substrate according to the related art.

FIG. 1 is an equivalent circuit diagram including capacitors of, for example, a smoothing circuit mounted on a circuit substrate of the related art. On a circuit substrate B1 in FIG. 1, a first capacitor 1 and a second capacitor 2 are connected in parallel. The capacitor 1 is defined by an electrostatic capacitance C1, an equivalent series resistance R1, and an equivalent series inductance L1. The capacitor 2 is defined by an electrostatic capacitance C2, an equivalent series resistance R2, and an equivalent series inductance L2. Furthermore, the circuit pattern on the circuit substrate has an equivalent inductance L, resistance R, and so on. Reference character S indicates a power supply voltage generating circuit which generates a power supply voltage. The power supply voltage generating circuit supplies a voltage to the smoothing circuit on the circuit substrate B1. Reference character T indicates a load to which the voltage from the power supply voltage generating circuit S is applied via the smoothing circuit. In FIG. 1, the power supply voltage generating circuit S is provided separately from the circuit substrate B1, however, the power supply voltage generating circuit S may be mounted on the circuit substrate B1.

Figure 2:
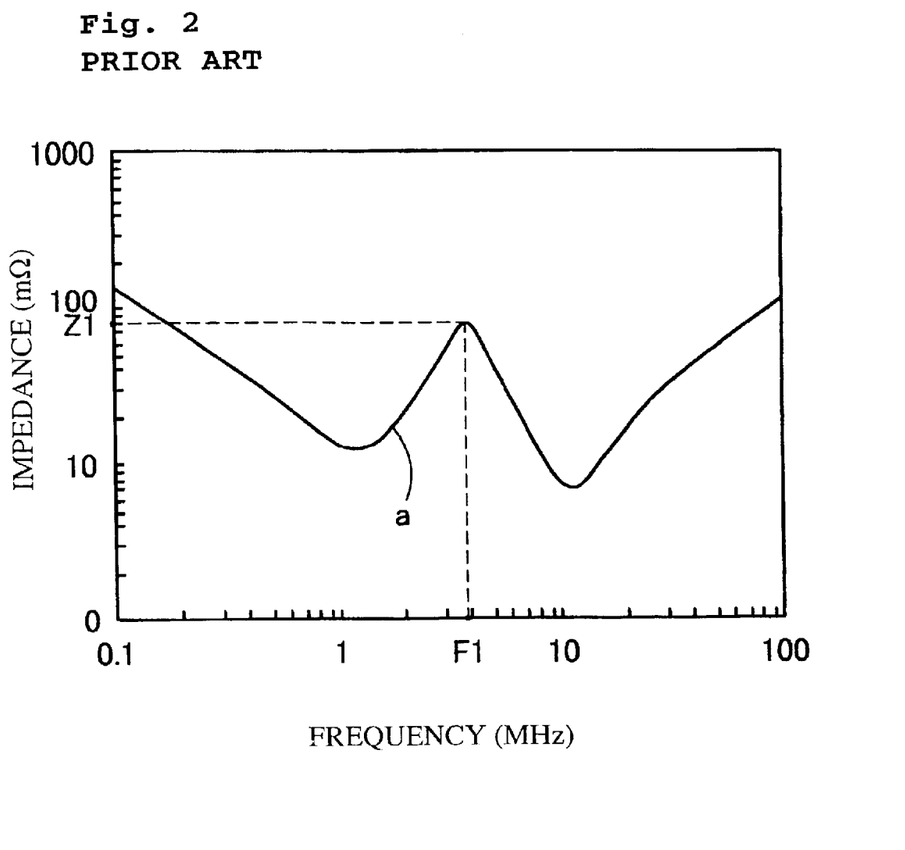
FIG. 2 is a graph showing the relationship between frequency and impedance in the smoothing circuit shown in FIG. 1.

FIG. 2 is a graph showing the relationship between the frequency and the impedance in the smoothing circuit (parallel capacitor circuit) shown in FIG. 1. As shown by line a in FIG. 2, a peak impedance Z1 is generated in this smoothing circuit at the parallel resonance frequency (anti-resonant point) F1.

Accordingly, setting the equivalent series resistance (ESR) of the capacitor to an appropriate value can be considered as one method to suppress the generation of such a peak impedance. In this case, since the necessary equivalent series resistance varies depending on the combined capacitors, it is necessary to arrange many equivalent series resistances so that they are suitable for all combinations. However, it is difficult to arrange this, if not almost impossible.

On the other hand, it is possible to set (regulate) the combined impedance at the anti-resonant point even when a chip resistor is mounted on the circuit substrate in series with the capacitor.

Figure 3:
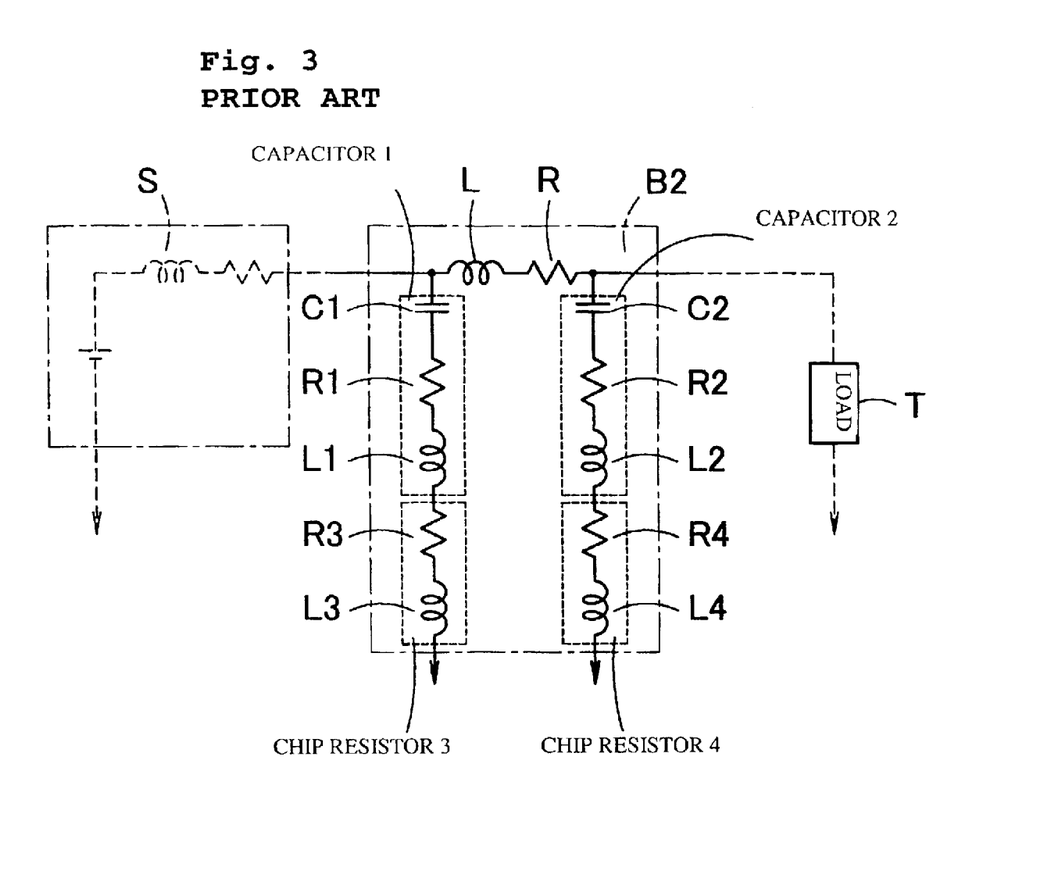
FIG. 3 is an equivalent circuit diagram including capacitors and chip resistors of a smoothing circuit mounted on a circuit substrate according to the related art.

FIG. 3 is an equivalent circuit diagram including, for example, smoothing circuit capacitors and chip resistors, which are mounted on the above-described circuit substrate. A series circuit defined by the capacitor 1 and a chip resistor 3 and a series circuit defined by the capacitor 2 and a chip resistor 4 are connected in parallel on a circuit substrate B2 in FIG. 3. The capacitor 1 is defined by an electrostatic capacitance C1, an equivalent series resistance R1, and an equivalent series inductance L1, and the capacitor 2 is defined by an electrostatic capacitance C2, an equivalent series resistance R2, and an equivalent series inductance L2. The chip resistor 3 is defined by an equivalent resistance R3 and an equivalent series inductance L3, and the chip resistor 4 is defined by an equivalent resistance R4 and an equivalent series inductance L4. Furthermore, the circuit pattern on the circuit substrate B2 includes an equivalent inductance L, resistance R, and so on. Moreover, reference character S indicates a power supply voltage generating circuit which generates a power supply voltage, which is then supplied to the smoothing circuit on the circuit substrate B2. Reference character T indicates a load to which the voltage from the power supply voltage generating circuit S is applied via the smoothing circuit. In FIG. 3, the power supply voltage generating circuit S is provided separately from the circuit substrate B2, however, the power supply voltage generating circuit S may also be mounted on the circuit substrate B2.

Figure 4:
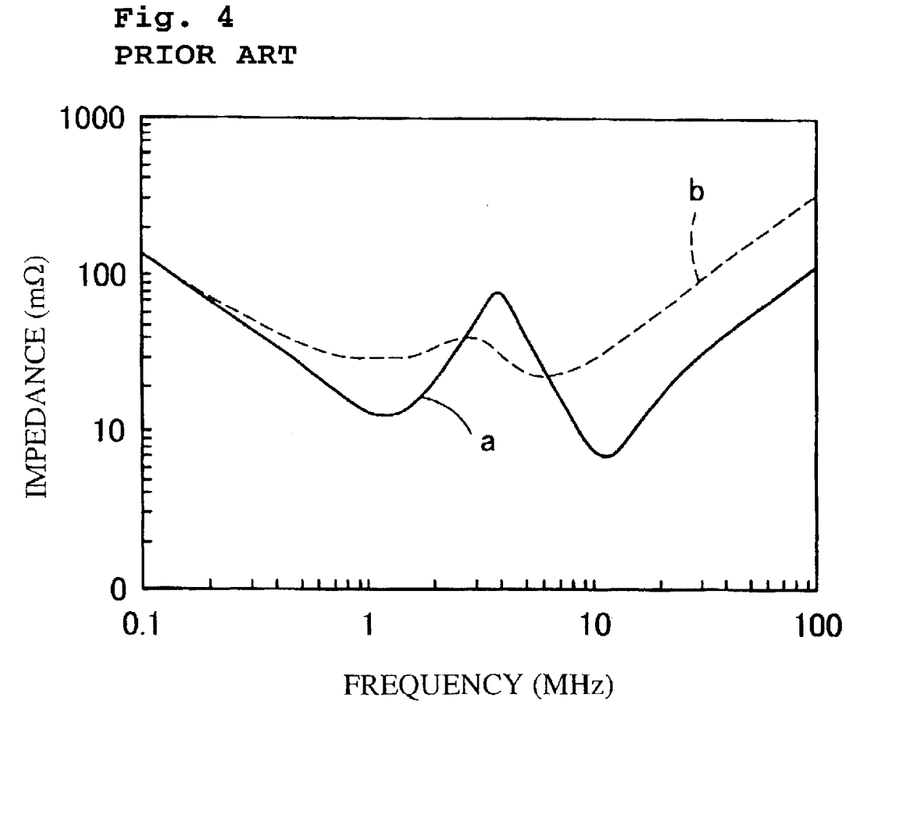
FIG. 4 is a graph showing the relationship between frequency and impedance in the smoothing circuit shown in FIG. 3.

FIG. 4 is a graph showing the relationship between the frequency and the impedance in the smoothing circuit shown in FIG. 3. The impedance of the smoothing circuit shown in FIG. 3 varies with respect to frequency as shown by line b. From this graph, it is clear that the impedance variation indicated by line b is small compared with the impedance variation indicated by line a (the same as in FIG. 2).

As can be understood from the structure of the circuit substrate according to the related art described above, even when a large-capacitance capacitor is used, it is possible to obtain a circuit in which the variation in impedance with respect to frequency is small, but, in this case, it is necessary to connect a resistance in series with the capacitor. However, when a chip resistor is mounted on the circuit substrate, since a series inductance component in the capacitor, due to the wiring lines, increases, faults such as deterioration of the decoupling ability occur. In addition, the required resistance is as small as several tens of milliohms to 100 mΩ, which is difficult to obtain as discrete resistance components.

Moreover, in order to form a resistance on the circuit substrate, a resistive film is disposed as a single circuit on the circuit substrate. Conductive particles such as aluminum oxide, tin oxide, tantalum nitride, etc. are used in this resistor film, these particles are mixed in either a glass or a binder to form a paste, the paste is applied to the substrate by printing or other process at predetermined positions and in predetermined shapes, and the substrate is baked at a high temperature, namely 600° C. or above.

However, in this method, the resistance easily varies depending on the baking temperature. There is a problem in that the variation in resistance becomes large particularly in cases where it is necessary to control the temperature while baking.

In the related art disclosed in Japanese Patent No. 2578264, a metal oxide layer is formed on the surface of external electrodes, and by making this metal oxide layer function as a resistance, the equivalent series resistance (ESR) is increased, and the resistance is determined by the film thickness of the metal oxide layer. If a structure such as this is used, it is possible to obtain a small resistance, for example, from several tens of milliohms to 100 mΩ.

However, in the method for forming such a metal oxide layer, it is extremely difficult to control the oxidation of the terminal electrodes, and if the degree of oxidation increases slightly, the internal electrodes are also oxidized. As a result, there is a problem in that it is not possible for this structure to function as a capacitor.

SUMMARY OF THE INVENTION

In order to overcome the problems described above, preferred embodiments of the present invention provide a circuit substrate in which it is possible to obtain a circuit in which the variation in impedance with respect to frequency is very small, even when using a large-capacitance capacitor.

In a circuit substrate according to a first preferred embodiment of the present invention, in which an electronic component is mounted at a predetermined position of a circuit pattern, resistive films are disposed on the surfaces of lands included in the circuit pattern and these resistive films are provided as resistances which connect external terminals of the electronic component in series with the lands of the circuit pattern.

In the circuit substrate according to the first preferred embodiment of the present invention, since the resistive films are disposed on the surfaces of the lands included in the circuit pattern and these resistive films are used as resistances connected in series to the electronic component, a resistance can be connected in series without increasing the inductance in the electronic component. For example, in the case where the electronic component is a capacitor, even when a large-capacitance capacitor is used, a circuit having a small impedance variation with respect to frequency can be obtained. Therefore, it is possible to provide a power supply circuit and so forth having stable operation and high response speed.

Preferably, the resistive films used in the circuit substrate are made of a conductive adhesive.

In this circuit substrate, since the circuit pattern and terminals of the electronic component are connected by the conductive adhesive, which has a resistance component, the connection state is equivalent to that in which a resistance is connected in series without increasing the inductance in the electronic component. For example, when the electronic component is a capacitor, even when a large-capacitance capacitor is used, a circuit having a small impedance variation with respect to frequency can be obtained. Therefore, it is possible to provide a power supply circuit and so forth having stable operation and a high response speed.

Preferably, the conductive adhesive used in the circuit substrate has a specific resistance of approximately $1 \times 10^{-4}$ to $1 \times 10^{-2}$ Ωcm.

In this circuit substrate, since a conductive adhesive having a specific resistance of approximately $1 \times 10^{-4}$ to $1 \times 10^{-2}$ Ωcm is used, it is possible to obtain a large value for the resistance connected in series with the electronic component. Accordingly, it is possible to greatly reduce the impedance variation with respect to frequency.

Preferably, the conductive adhesive used in the circuit substrate has a resistance component in the direction that is substantially perpendicular to the surface of the circuit pattern, and the resistance can be set according to the film thickness of the conductive adhesive.

In this circuit substrate, it is possible to vary the resistance by regulating the film thickness of the conductive adhesive, which has a resistance component in the direction that is substantially perpendicular to the surface of the circuit pattern. Therefore, since it is possible to freely set the resistance of the conductive adhesive according to the type of electronic component, it can be appropriately set according to the circuit type, thus increasing the versatility.

Preferably, the conductive adhesive used in the circuit substrate preferably includes a combination of at least two types of conductive adhesives having different resistances. Electrical connection and mechanical connection are provided by one conductive adhesive having a smaller resistance, and the resistance component in the direction that is substantially perpendicular to the surface of the circuit pattern is provided by the other conductive adhesive having a larger resistance. The resistance can be set according to the film thickness of the conductive adhesives.

In this circuit substrate, by providing the electrical connection and mechanical connection using the low-resistance conductive adhesive, the electronic component can be electrically and mechanically connected. Moreover, since the resistance component in the direction that is substantially perpendicular to the surface of the circuit pattern is provided by the high-resistance conductive adhesive and the resistance can be set according to the film thickness of the conductive adhesive, the resistance of the conductive adhesive can be freely set according to the type of electronic component, and accordingly, it can be appropriately set according to the circuit type, thus improving the versatility.

Preferably, in the circuit substrate, the ratio of the resistances of the low-resistance conductive adhesive and the high-resistance conductive adhesive is approximately ⅔ or less.

In this circuit substrate, since the ratio of the resistances of the low-resistance conductive adhesive and the high-resistance conductive adhesive is approximately ⅔ or less, even if, for example, the variation in the CR components is about ±20% and the low-resistance conductive adhesive varies by about ±20%, in other words, even if there is about 40% variation, as long as the remaining high-resistance component does not vary by about 60%, the variation in resistance is within approximately ±20%. Therefore, the ratio of resistances is preferably about 40%:60%, that is, approximately ⅔, which ensures that the circuit operation is stable.

Preferably, the conductive adhesive in the circuit substrate preferably uses a filler including one material or a mixture of two or more materials selected from silver, copper, nickel, and carbon.

In this circuit substrate, by using a conductive adhesive in which the filler is one material or a mixture of two or more materials selected from silver, copper, nickel, and carbon, it is possible to obtain a resistance connected in series with the electronic component, and furthermore, by changing the type of filler, it is possible to vary the resistance.

Preferably, in the circuit substrate, the low-resistance conductive adhesive uses a filler including silver or copper, and the high-resistance conductive adhesive uses a filler including at least carbon.

In this circuit substrate, by using a conductive adhesive using a filler including silver or copper, a small resistance can be mounted, and by using a conductive adhesive using a filler including at least carbon, a large resistance can be mounted.

Other features, elements, characteristics and advantages of the present invention will become more apparent from the following detailed description of preferred embodiments of the present invention with reference to the attached drawings.

BRIEF DESCRIPTION OF THE DRAWINGS

FIG. 8 is a diagram showing examples of the capacitance (electrostatic capacitance) of the capacitors used in the first preferred embodiment, the parasitic impedance thereof, and so on.

FIG. 10 is a diagram showing the relationship between specific resistance and the filler type used in the first preferred embodiment of the present invention, and so on.

DETAILED DESCRIPTION OF PREFERRED EMBODIMENTS

Figure 5:
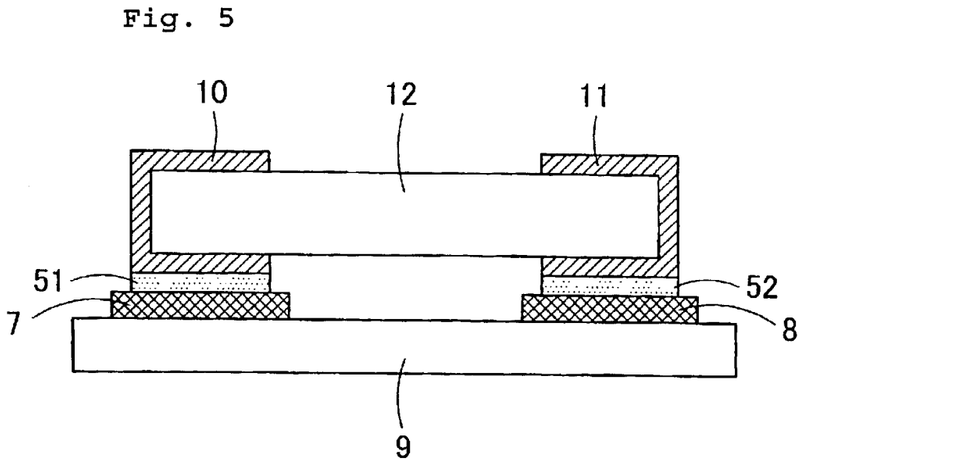
FIG. 5 is a cross-sectional view showing the structure of a circuit substrate according to a first preferred embodiment of the present invention.

FIG. 5 is a cross-sectional view showing the structure of a circuit substrate according to a first preferred embodiment of the present invention. The circuit substrate according to this first preferred embodiment has a structure including an insulating substrate 9, lands 7 and 8 of a circuit pattern printed on the insulating substrate 9, and resistive films 51 and 52, which are disposed on the surfaces of these lands 7 and 8, respectively.

At predetermined positions of the lands 7 and 8 on this circuit substrate where an electronic component, for example, a capacitor 12, to which it is desired to connect a series resistance is mounted, the resistive films 51 and 52 are formed by applying, by screen printing, a conductive resin ink into which is mixed a high-specific-resistance conductive filler, followed by drying and hardening. By connecting external electrodes 10 and 11 on the capacitor 12 to the resistive films 51 and 52, respectively, this structure is equivalent to a resistance connected in series to the capacitor 12. The resistive films 51 and 52 may also be disposed on the mounting surface side of the external electrodes 10 and 11 on the capacitor 12.

Figure 6:
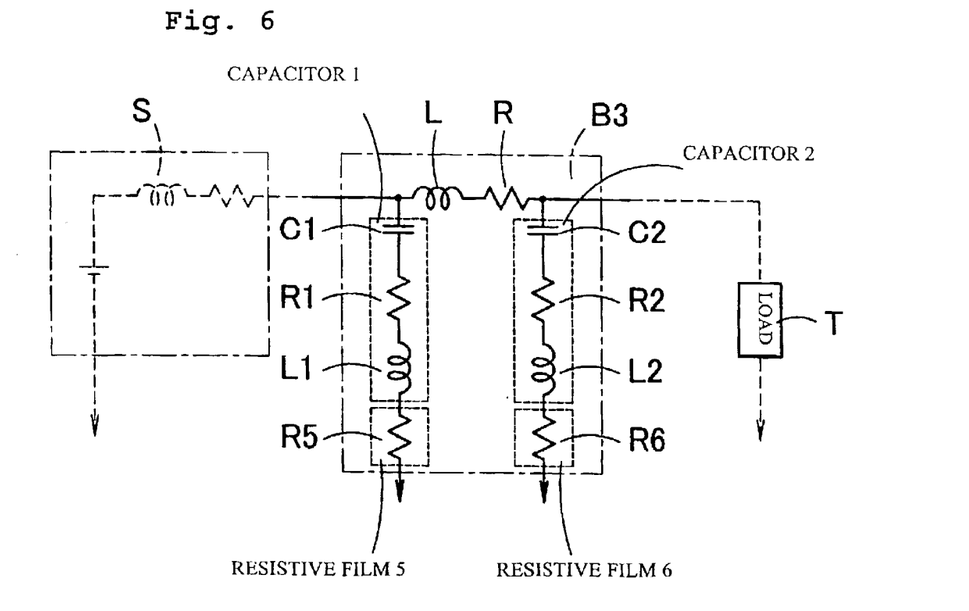
FIG. 6 is an equivalent circuit diagram including capacitors of a smoothing circuit which is mounted on the circuit substrate according to the first preferred embodiment of the present invention.

FIG. 6 is an equivalent circuit diagram including capacitors of, for example, a smoothing circuit mounted on the circuit substrate according to the first preferred embodiment of the present invention. On a circuit substrate B3 in FIG. 6, a series circuit disposed of a capacitor 1 and a resistive film 5 and a series circuit including a capacitor 2 and a resistive film 6 are connected in parallel. The capacitor 1 includes an electrostatic capacitance C1, an equivalent series resistance R1, and an equivalent series inductance L1. The capacitor 2 includes an electrostatic capacitance C2, an equivalent series resistance R2, and an equivalent series inductance L2. The resistive film 5 includes an equivalent resistance R5 and the resistive film 6 includes an equivalent resistance R6. Furthermore, the circuit pattern on the circuit substrate B3 has an equivalent inductance L and resistance R.

If it is assumed that, for example, the capacitor 1 in FIG. 6 represents the capacitor 12 in FIG. 5, the resistive film 5 in FIG. 6 is equivalent to the resistive films 51 and 52 in FIG. 5. Reference character S indicates a power supply voltage generating circuit which generates a power supply voltage, and this voltage is supplied to the smoothing circuit on the circuit substrate B3. Reference character T indicates a load to which the voltage from the power supply voltage generating circuit is applied, via the smoothing circuit. In FIG. 6, the power supply voltage generating circuit S is provided separately from the circuit substrate B3, however, the power supply voltage generating circuit S may also be mounted on the circuit substrate B3.

Figure 7:
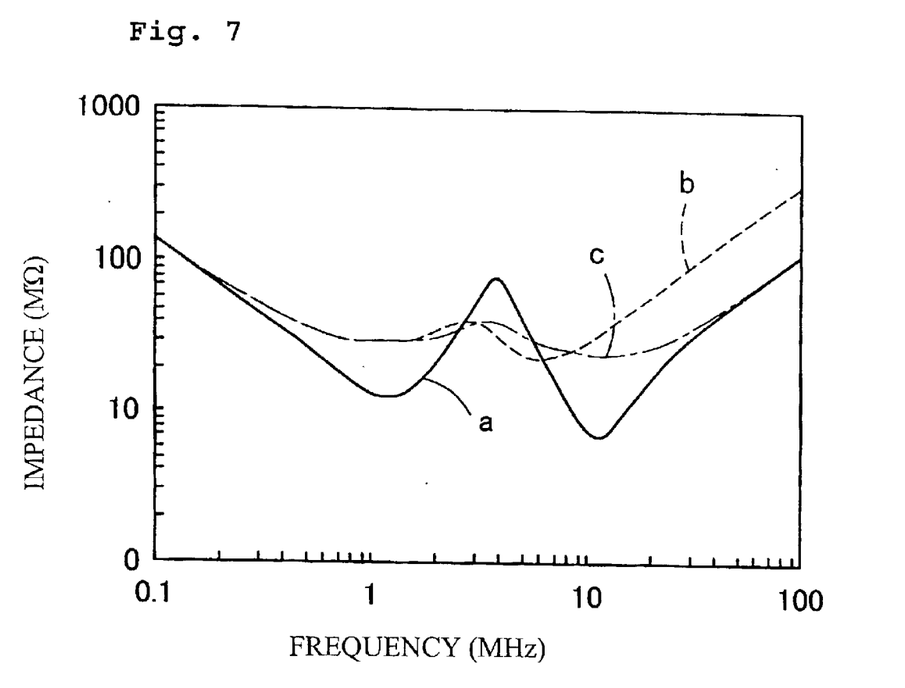
FIG. 7 is a graph showing the relationship between frequency and impedance in the smoothing circuit shown in FIG. 6.

FIG. 7 is a graph showing the relationship between frequency and impedance in the smoothing circuit shown in FIG. 6. The smoothing circuit impedance shown in FIG. 7 varies with respect to frequency as indicated by line c. From this graph, it is clear that the variation in impedance indicated by line c is less than the variation in impedance of the related art indicated by lines a and b.

According to the circuit substrate of the first preferred embodiment described above, since the resistive films 51 and 52 are disposed on the surfaces of the lands 7 and 8 in the circuit pattern printed on the insulating substrate 9 and these resistive films 51 and 52 are used as resistances that are connected in series to the capacitor 12, a resistance is connected in series without increasing the inductance in the capacitor 12. Accordingly, even when using a large-capacitance capacitor, a circuit having a small impedance variation with respect to frequency can be obtained. Therefore, it is possible to provide a power supply circuit and so forth with stable operation and high response speed.

Figure 8:
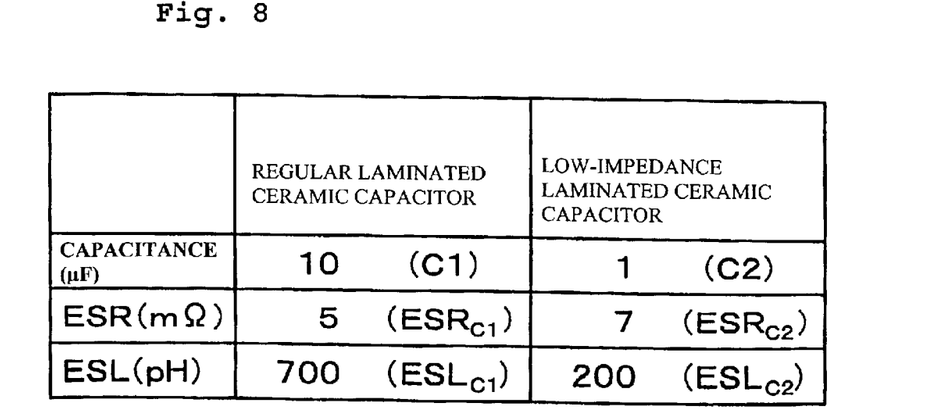

For reference, examples of the capacitance of the capacitor used in the first preferred embodiment, the parasitic impedance thereof, and so on are shown in FIG. 8. According to FIG. 8, it is illustrated that a regular laminated ceramic capacitor C1 has a capacitance of approximately 10 $\mu$F, an equivalent series resistance of about 5 m$\Omega$, and an equivalent series inductance of about 700 pH, and a low-inductance laminated ceramic capacitor C2 has a capacitance of about 1 $\mu$F, an equivalent series resistance of about 7 m$\Omega$, and an equivalent series inductance of about 200 pH.

Figure 9:
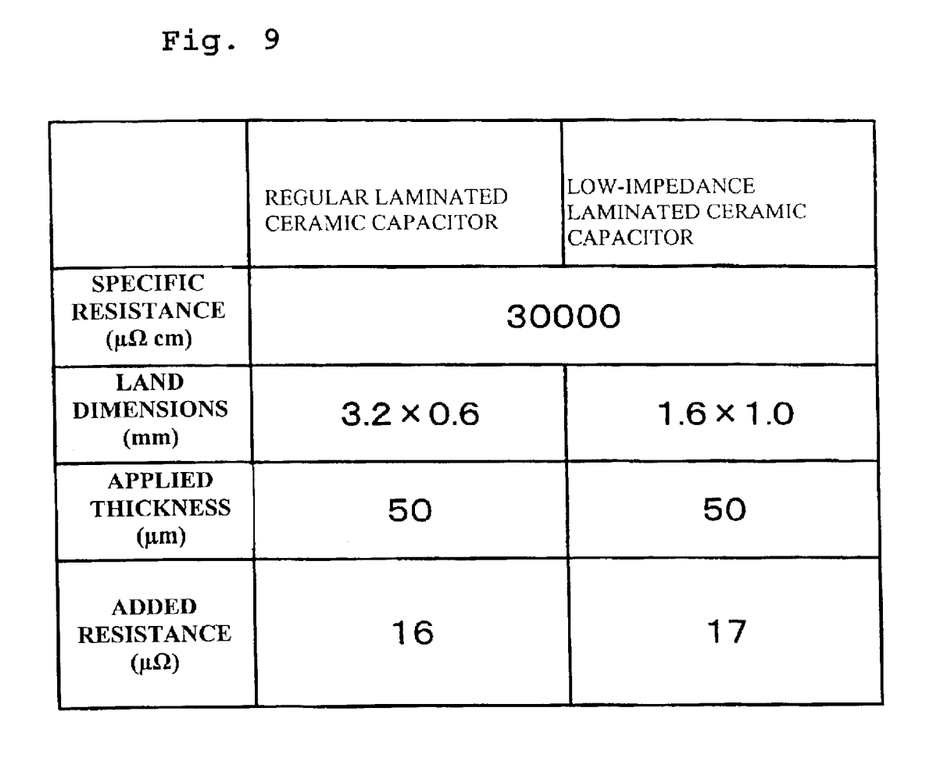
FIG. 9 is a diagram showing examples of the specific resistance, the applied thickness, and so on of a conductive resin ink used in the first preferred embodiment of the present invention.

Moreover, examples of the specific resistance of the conductive resin ink used in the first preferred embodiment, the applied thickness, and so on are shown in FIG. 9. According to FIG. 9, it is shown that for the regular laminated ceramic capacitor C1, the specific resistance of the conductive resin ink is about 30,000 $\mu\Omega$cm, the dimensions of the land are approximately 3.2×0.6 mm, the applied thickness is about 50 $\mu$m, and the added resistance is about 16 $\mu\Omega$; and for the low-inductance laminated ceramic capacitor C2, the specific resistance of the conductive resin ink is about 30,000 $\mu\Omega$cm, the dimensions of the land are approximately 1.6×1.0 mm, the applied thickness is about 50 $\mu$m, and the added resistance is about 17 $\mu\Omega$. In order to obtain such a desired resistance (added resistance), the dimensions of the lands and the applied thickness of the conductive resin ink may be set to suitable values. In other words, if the dimensions of the lands and the applied thickness of the conductive resin ink are changed, a resistive film having the desired resistance can be obtained.

Figure 10:
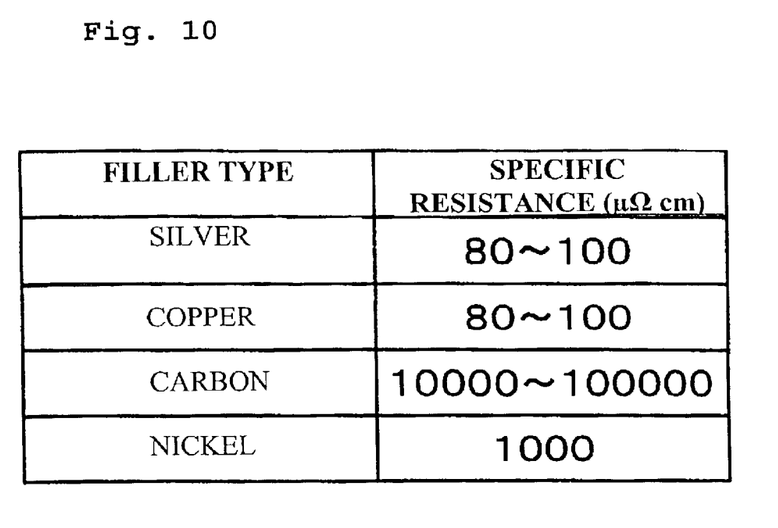

FIG. 10 shows the relationship between the filler type and the specific resistance. According to FIG. 10, it is shown that the specific resistance is about 80 $\mu\Omega$cm to about 100 $\mu\Omega$cm for silver, about 80 $\mu\Omega$cm to about 100 $\mu\Omega$cm for copper, about 10,000 $\mu\Omega$cm to about 100,000 $\mu\Omega$cm for carbon, and about 1,000 $\mu\Omega$cm for nickel. It is possible to obtain an arbitrary value for the specific resistance of the conductive resin ink depending on the filler type and so on.

Therefore, according to the first preferred embodiment, the thickness of the resistive film can be set as desired according to the screen pattern and printing conditions used in printing. Moreover, since the resistance added to the capacitor can be set to an arbitrary value depending on the specific resistance of the material used, the applied thickness, and the dimensions of the lands, it is possible to add the optimum resistance according to the capacitor combination used.

Figure 11:
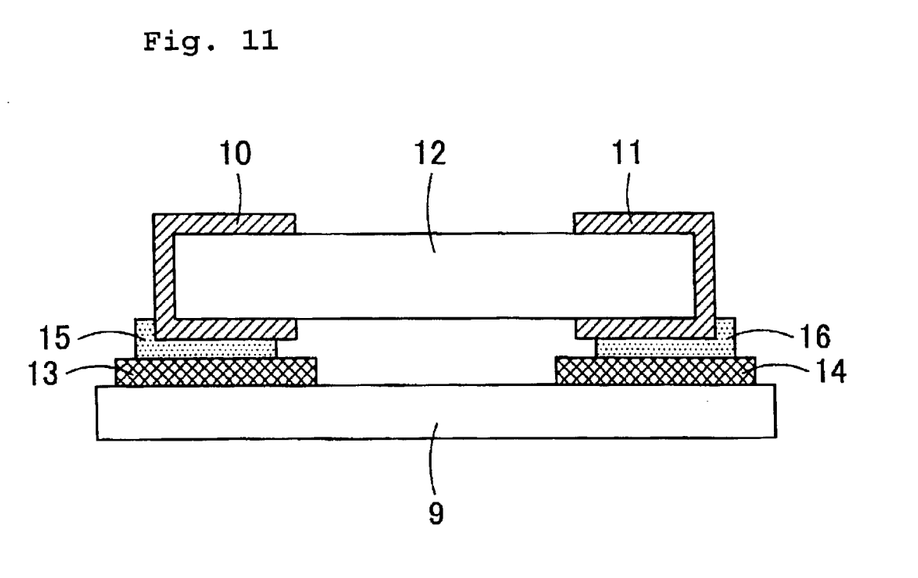
FIG. 11 is a cross-sectional view showing the structure of a circuit substrate according to a second preferred embodiment of the present invention.

FIG. 11 is a cross-sectional view showing the structure of a circuit substrate according to a second preferred embodiment of the present invention. The circuit substrate according to this second preferred embodiment has a structure including an insulating substrate 9, circuit patterns 13 and 14 printed on this insulating substrate 9, and conductive adhesives 15 and 16 which bond these circuit patterns 13 and 14 with external electrodes 10 and 11, respectively, on a capacitor (for example, a laminated ceramic capacitor) 12. The conductive adhesives 15 and 16 are disposed by transcribing them using a known screen printing technique of the related art to form them on the circuit patterns 13 and 14. Then, the circuit patterns 13 and 14 are aligned with the external electrodes 10 and 11, respectively, on the capacitor 12, with the conductive adhesives 15 and 16 therebetween, and after this, by applying pressure between the circuit patterns 13 and 14 and the external electrodes 10 and 11 on the capacitor 12, while also applying heat to the conductive adhesives 15 and 16, the external electrodes 10 and 11 on the capacitor 12 are fixed on the insulating substrate 9 by the conductive adhesives 15 and 16, respectively.

In this circuit substrate, an insulating substrate is mentioned. However, the present invention is not limited to this, and a Si semiconductor substrate, a GaAs semiconductor substrate, or other suitable substrate may also be used. Furthermore, one material or a mixture of two or more materials selected from Ag, Cu, Ni, and C (carbon) is used as the filler of the conductive adhesive.

In this way, according to the second preferred embodiment, by disposing the conductive adhesives between the circuit patterns and the external electrodes on the capacitor, they can be bonded together while being electrically connected. Moreover, since the conductive adhesive has a resistance component, the resistance component is arranged in series with the capacitor. Furthermore, since one material or a mixture of two or more materials selected from Ag, Cu, Ni, and C is used as the filler of the conductive adhesive, in order to have a high specific resistance, the equivalent series inductance component of the capacitor is reduced as compared to a general conductive adhesive in which the specific resistance is approximately 1×10$^{-5}$ $\Omega$cm to approximately 9×10$^{-5}$ $\Omega$cm.

Figure 12:
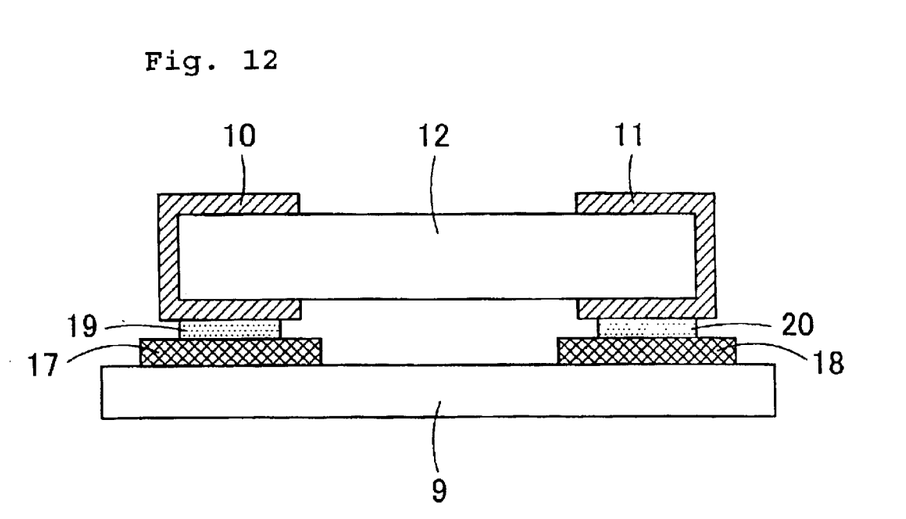
FIG. 12 is a cross-sectional view showing the structure of a circuit substrate according to a third preferred embodiment of the present invention.

FIG. 12 is a cross-sectional view showing the structure of a circuit substrate according to a third preferred embodiment of the present invention. The circuit substrate shown in FIG. 3 has a structure which includes an insulating substrate 9, circuit patterns 17 and 18 which are printed on this insulating substrate 9, and conductive adhesives 19 and 20 which bond these circuit patterns 17 and 18 with external electrodes 10 and 11 on a capacitor (for example, a laminated ceramic capacitor) 12. The conductive adhesives 19 and 20 have a resistance component in the direction that is substantially perpendicular to the surfaces of the circuit patterns 17 and 18, and it is possible to set the resistance values according to the film thickness of the conductive adhesives 19 and 20.

The conductive adhesives 19 and 20 are disposed by transcribing them using a known screen printing technique of the related art to form them on the circuit patterns 17 and 18, respectively. Then, the circuit patterns 17 and 18 are aligned with the external electrodes 10 and 11, respectively, on the capacitor 12, with the conductive adhesives 19 and 20 therebetween, and after this, by applying pressure between the circuit patterns 17 and 18 and the external electrodes 10 and 11, respectively, on the capacitor 12, while also applying heat to the conductive adhesives 19 and 20, the external electrodes 10 and 11 on the capacitor 12 are fixed on the insulating substrate 9 by the conductive adhesives 19 and 20.

In this circuit substrate an insulating substrate is mentioned. However, the present invention is not limited to this, and a Si semiconductor substrate, a GaAs semiconductor substrate, or other suitable substrate may also be used. Furthermore, one material or a mixture of two or more materials selected from Ag, Cu, Ni, and C is used as the filler of the conductive adhesive.

In this way, according to the third preferred embodiment, by disposing the conductive adhesives between the circuit patterns and the external electrodes on the capacitor, they can be bonded together while being electrically connected. Moreover, since the conductive adhesive has a resistance component, the resistance component is arranged in series with the capacitor. Furthermore, since one material or a mixture of two or more materials selected from Ag, Cu, Ni, and C is used as the filler of the conductive adhesive, in order to have a high specific resistance, the equivalent series inductance component of the capacitor is reduced as compared to a general conductive adhesive in which the specific resistance is approximately $1 \times 10^{-5}$ Ωcm to approximately $9 \times 10^{-5}$ Ωcm.

In particular, according to the third preferred embodiment, by regulating the film thickness of the conductive adhesives which have a resistance component in the direction that is substantially perpendicular to the surface of the circuit patterns, it is possible to vary the resistance. Moreover, since there is no conductive adhesive on the side surfaces of the electronic component, as in the second preferred embodiment, the number of factors determining the resistance value is reduced, and it is therefore easier to set the resistance value compared to the second preferred embodiment. In this way, since it is possible to freely set the resistances of the conductive adhesives according to the type of electronic component, they can be appropriately set according to the type of circuit, which increases the versatility.

Figure 13:
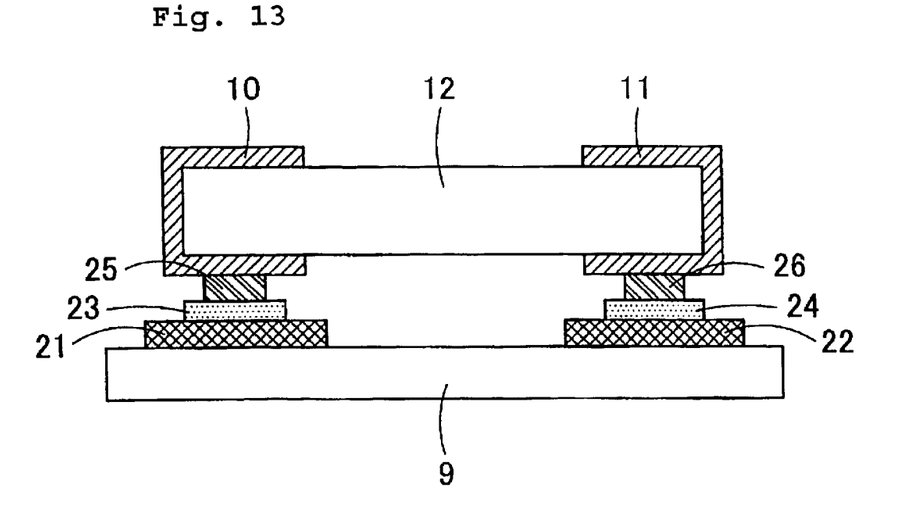
FIG. 13 is a cross-sectional view showing the structure of a circuit substrate according to a fourth preferred embodiment of the present invention.

FIG. 13 is a cross-sectional view showing the structure of a circuit substrate according to a fourth preferred embodiment of the present invention. The circuit substrate according to this fourth preferred embodiment has a structure which includes an insulating substrate 9, circuit patterns 21 and 22 which are printed on this insulating substrate 9, and conductive adhesives 23, 24, 25, and 26 which bond these circuit patterns 21 and 22 with external electrodes 10 and 11, respectively, on a capacitor (for example, a laminated ceramic capacitor) 12. The conductive adhesives 23 and 24 are given high resistance values by using a filler which is a mixture of silver and carbon, they have resistance components in the direction that is substantially perpendicular to the circuit patterns 21 and 22, and the resistance values thereof can be set depending on the film thickness. The conductive adhesives 25 and 26 are given low resistance value by using a silver filler, and they electrically and mechanically connect the external electrodes 10 and 11 on the capacitor 12 with the conductive adhesives 23 and 24, respectively.

The conductive adhesives 23 and 24 use a filler which is a mixture of silver and carbon so that the resistance is, for example, about 1 mΩ to about 1 Ω, and are disposed by forming them on the circuit patterns 21 and 22 by transcription processing using, for example, a known printing technique according to the related art. Then, the conductive adhesives 23 and 24 are hardened and the film thickness thereof on the circuit patterns 21 and 22 is fixed. Subsequently, the conductive adhesives 25 and 26, using a silver filler so that the resistance is, for example, about 1 mΩ, are provided on these hardened conductive adhesives 23 and 24, and the conductive adhesives 23 and 24 on the circuit patterns 21 and 22 are aligned with the external electrodes 10 and 11 on the capacitor 12, with the conductive adhesives 25 and 26 being placed therebetween. After this, by applying pressure between the circuit patterns 21 and 22 and the external electrodes 10 and 11, respectively, on the capacitor 12, while also applying heat to the conductive adhesives 25 and 26, the external electrodes 10 and 11, respectively, on the capacitor 12 are fixed to the insulating substrate 9 by the conductive adhesives 25 and 26, respectively.

In this circuit substrate, an insulating substrate is mentioned. However, the present invention is not limited to this, and a Si semiconductor substrate, a GaAs semiconductor substrate, or other suitable substrate may also be used. Furthermore, one material or a mixture of two or more materials selected from Ag, Cu, Ni, and C is used as the filler of the conductive adhesive.

In this way, according to the fourth preferred embodiment, by disposing the conductive adhesives between the circuit patterns and the external electrodes on the capacitor, they can be bonded together while being electrically connected. Moreover, since the conductive adhesives have a resistance component, the resistance component is arranged in series with the capacitor. Furthermore, since one material or a mixture of two or more materials selected from Ag, Cu, Ni, and C is used as the filler of the conductive adhesive, in order to have a high specific resistance, the equivalent series inductance component of the capacitor is reduced as compared to a general conductive adhesive in which the specific resistance is approximately $1 \times 10^{-5}$ Ωcm to approximately $9 \times 10^{-5}$ Ωcm.

In particular, according to the fourth preferred embodiment, by using a conductive adhesive having a small resistance to provide electrical and mechanical connection, it is possible to obtain a stable equivalent series resistance having a rate of variation that is small as a whole. Moreover, since the high-resistance conductive adhesive is hardened beforehand, it is easier to regulate the film thickness thereof. Moreover, since the conductive adhesives have a resistance component in the direction that is substantially perpendicular to the surface of the circuit patterns, the resistance values can be set according to the film thicknesses thereof, and accordingly, it is possible to freely set the resistances of the conductive adhesives according to the type of electronic component, and therefore, they can be appropriately set according to the type of circuit, which increases the versatility.

Furthermore, in each of the preferred embodiments described above, a description was given of the case where capacitors of a smoothing circuit are mounted on the circuit substrate. However, the present invention is not limited to this type of circuit, and it is possible to apply the present invention to other circuits including capacitors. Also, the present invention is not limited to capacitors. It may also be applied to other laminated electronic components, such as inductors.

According to preferred embodiments of the present invention as described above, since resistive films are disposed on the surfaces of lands, included in a circuit pattern, for mounting an electronic component and are structured such that these resistive films are used as resistances connected in series to the electronic component, it is possible to prevent an increase in the inductance of the electronic component. Accordingly, for example, in the case where the electronic component is a capacitor, even when a large-capacitance capacitor is used, a circuit having a small inductance variation with respect to frequency can be obtained. Therefore, it is possible to provide a power supply circuit and so forth having stable operation and high response speed.

Furthermore, according to preferred embodiments of the present invention, since a structure in which circuit patterns and terminals of an electronic component are connected to each other via conductive adhesives having resistance components is used, the connection state is equivalent to that in which a resistance is connected in series to the electronic component, and it is possible to prevent an increase in inductance of the electronic component. Accordingly, for example, in the case where the electronic component is a capacitor, even when a large-capacitance capacitor is used, a circuit having a small impedance variation with respect to frequency can be obtained. Therefore, it is possible to provide a power supply circuit having stable operation and high response speed.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A circuit substrate for mounting an electronic component at predetermined positions thereof, comprising:
   a circuit pattern provided on said circuit substrate, said circuit pattern including a land for mounting said electronic component; and
   a resistive film disposed on a major surface of said land;
   wherein said resistive film defines a resistance which connects the land of the circuit pattern in series with an external terminal on the electronic component.

2. A circuit substrate according to claim 1, wherein said resistive film includes a conductive adhesive.

3. A circuit substrate according to claim 2, wherein the conductive adhesive is a combination of at least two types of conductive adhesives having different resistances, electrical connection and mechanical connection are provided by a conductive adhesive having a smaller resistance, the resistance component in a direction that is substantially perpendicular to the surface of the circuit pattern is defined by another conductive adhesive having a larger resistance, and the resistances are set according to the film thickness of the conductive adhesives.

4. A circuit substrate according to claim 3, wherein a ratio of the resistances of the low-resistance conducive adhesive and the high-resistance conductive adhesive is approximately ⅔ or less.

5. A circuit substrate according to claim 3, wherein the low-resistance conductive adhesive includes a filler including at least one of silver and copper, and the high-resistance conductive adhesive includes a filler including at least carbon.

6. A circuit substrate according to claim 2, wherein said conductive adhesive has a specific resistance of from about $1 \times 10^{-4}$ Ωcm to about $1 \times 10^{-2}$ Ωcm.

7. A circuit substrate according to claim 2, wherein the conductive adhesive has a resistance component in a direction that is substantially perpendicular to the surface of the circuit pattern and the resistance of the conductive adhesive is set according to the film thickness thereof.

8. A circuit substrate according to claim 2, wherein the conductive adhesive includes a filler including one material or a mixture of two or more materials selected from silver, copper, nickel, and carbon.

9. A circuit substrate according to claim 1, wherein a plurality of lands are provided in said circuit pattern and a plurality of resistive films are provided on said plurality of lands.

10. A circuit substrate according to claim 1, wherein the circuit pattern and the resistive film define a smoothing circuit.

11. A circuit substrate according to claim 1, wherein the circuit substrate is made of one of an insulating material, a Si semiconductor material, and a GaAs semiconductor material.

12. An electronic apparatus comprising:
    a circuit substrate having an electronic component at a predetermined position thereof, the circuit substrate including:
    a circuit pattern provided on said circuit substrate, said circuit pattern including a land for mounting said electronic component; and
    a resistive film disposed on a major surface of said land;
    wherein said resistive film defines a resistance which connects the land of the circuit pattern in series with an external terminal on the electronic component.

13. The electronic apparatus according to claim 12, wherein said resistive film includes a conductive adhesive.

14. The electronic apparatus according to claim 13, wherein the conductive adhesive is a combination of at least two types of conductive adhesives having different resistances, electrical connection and mechanical connection are provided by a conductive adhesive having a smaller resistance, the resistance component in a direction that is substantially perpendicular to the surface of the circuit pattern is defined by another conductive adhesive having a larger resistance, and the resistances are set according to the film thickness of the conductive adhesives.

15. The electronic apparatus according to claim 14, wherein a ratio of the resistances of the low-resistance conducive adhesive and the high-resistance conductive adhesive is approximately ⅔ or less.

16. The electronic apparatus according to claim 14, wherein the low-resistance conductive adhesive includes a filler including at least one of silver and copper, and the high-resistance conductive adhesive includes a filler including at least carbon.

17. The electronic apparatus according to claim 13, wherein said conductive adhesive has a specific resistance of from about $1 \times 10^{-4}$ Ωcm to about $1 \times 10^{-2}$ Ωcm.

18. The electronic apparatus according to claim 13, wherein the conductive adhesive has a resistance component in a direction that is substantially perpendicular to the surface of the circuit pattern and the resistance of the conductive adhesive is set according to the film thickness thereof.

19. The electronic apparatus according to claim 13, wherein the conductive adhesive includes a filler including one material or a mixture of two or more materials selected from silver, copper, nickel, and carbon.

20. The electronic apparatus according to claim 12, wherein a plurality of lands are provided in said circuit pattern and a plurality of resistive films are provided on said plurality of lands.

21. The electronic apparatus according to claim 12, wherein the circuit pattern and the resistive film define a smoothing circuit.

22. The electronic apparatus according to claim 12, wherein the circuit substrate is made of one of an insulating material, a Si semiconductor material, and a GaAs semiconductor material.

* * * * *